United States Patent
Lee et al.

(10) Patent No.: US 9,257,234 B2
(45) Date of Patent: Feb. 9, 2016

(54) MULTILAYER CERAMIC CAPACITOR AND BOARD HAVING THE SAME MOUNTED THEREON

(71) Applicant: SAMSUNG ELECTRO-MECHANICS CO., LTD., Suwon-Si, Gyeonggi-Do (KR)

(72) Inventors: Min Gon Lee, Suwon-Si (KR); Jong Han Kim, Suwon-Si (KR); Kyu Ha Lee, Suwon-Si (KR); Jae Hyuk Sim, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 127 days.

(21) Appl. No.: 14/254,662

(22) Filed: Apr. 16, 2014

(65) Prior Publication Data
US 2015/0213955 A1    Jul. 30, 2015

(30) Foreign Application Priority Data
Jan. 24, 2014 (KR) .................. 10-2014-0008860

(51) Int. Cl.
| | |
|---|---|
| H01G 4/30 | (2006.01) |
| H01G 4/12 | (2006.01) |
| H01G 4/005 | (2006.01) |
| H05K 1/18 | (2006.01) |

(52) U.S. Cl.
CPC .......... *H01G 4/30* (2013.01); *H01G 4/005* (2013.01); *H01G 4/12* (2013.01); *H05K 1/181* (2013.01); *H05K 2201/10015* (2013.01); *H05K 2201/2045* (2013.01)

(58) Field of Classification Search
CPC ................................................ H01G 4/30
USPC ........................ 361/301–305, 321.1
See application file for complete search history.

(56) References Cited

U.S. PATENT DOCUMENTS

| | | | | |
|---|---|---|---|---|
| 2011/0157765 | A1* | 6/2011 | Kim | H01G 4/01 361/303 |
| 2012/0019099 | A1 | 1/2012 | Sato et al. | |
| 2013/0208401 | A1* | 8/2013 | Shirakawa | H01G 13/06 361/305 |
| 2015/0043127 | A1* | 2/2015 | Rinner | H01G 4/30 361/303 |
| 2015/0155100 | A1* | 6/2015 | Morita | H01G 4/30 361/301.4 |

FOREIGN PATENT DOCUMENTS

| | | |
|---|---|---|
| JP | 2012028458 A | 2/2012 |
| KR | 2006-0082671 A | 7/2006 |

* cited by examiner

*Primary Examiner* — Hoa C Nguyen
*Assistant Examiner* — Stanley Tso
(74) *Attorney, Agent, or Firm* — McDermott Will & Emery LLP

(57) ABSTRACT

A multilayer ceramic capacitor may include: an active part including a plurality of first and second internal electrodes; upper and lower cover layers; and first and second external electrodes including head parts and band parts. When a thickness of the upper or lower cover layer is defined as C, a width of a margin portion of the ceramic body in a width direction is defined as M, a cross-sectional area of the ceramic body in a width-thickness direction is defined as Ac, a cross-sectional area of the active part in a width-thickness direction in a portion thereof in which the first and second internal electrodes are overlapped with each other in a thickness direction is defined as Aa, and a width of the band part of the first or second external electrode is defined as B, $1.826 \leq C/M \leq 4.686$, $0.2142 \leq Aa/Ac \leq 0.4911$, and $0.5050 \leq C/B \leq 0.9094$ may be satisfied.

14 Claims, 4 Drawing Sheets

A-A'

MULTILAYER CERAMIC CAPACITOR AND BOARD HAVING THE SAME MOUNTED THEREON

CROSS-REFERENCE TO RELATED APPLICATION

This application claims the benefit of Korean Patent Application No. 10-2014-0008860 filed on Jan. 24, 2014, with the Korean Intellectual Property Office, the disclosure of which is incorporated herein by reference.

BACKGROUND

The present disclosure relates to a multilayer ceramic capacitor and a board having the same mounted thereon.

A multilayer ceramic capacitor, one of multilayer chip electronic components, is a chip-shaped condenser mounted on printed circuit boards of various electronic products such as display devices, for example, liquid crystal displays (LCDs), plasma display panels (PDPs) and the like, as well as computers, smartphones, mobile phones, and the like, to charge and discharge electricity therein.

Since such a multilayer ceramic capacitor (MLCC) has advantages such as a small size, high capacitance, ease of mounting, or the like, such a multilayer ceramic capacitor may be used as a component in various electronic devices.

The multilayer ceramic capacitor may have a structure in which a plurality of dielectric layers and internal electrodes having different polarities are alternately stacked while being interposed between the dielectric layers.

Since the dielectric layer has piezoelectric and electrostrictive properties, a piezoelectric phenomenon occurs between the internal electrodes when a direct current (DC) or alternating current (AC) voltage is applied to the multilayer ceramic capacitor, such that vibrations may be generated.

These vibrations may be transferred to a board on which the multilayer ceramic capacitor is mounted through external electrodes of the multilayer ceramic capacitor, such that the entirety of the board is a sound radiating surface to generate a vibration sound, noise.

The vibration sound may be within an audio frequency range of 20 to 20,000 Hz, which may cause listener discomfort and is referred to as an acoustic noise.

Recently, a degree of the acoustic noise has become an important factor determining quality of the multilayer ceramic capacitor.

In accordance with an increase in capacitance of the multilayer ceramic capacitor, a mechanical deformation amount of dielectrics may be inevitably increased. Therefore, various methods for solving this problem have been attempted.

Among these methods, a method of controlling an acoustic noise by controlling an amount of solder used to bond the board and the multilayer ceramic capacitor to each other has been disclosed.

However, in this method, bonding strength between the board and the multilayer ceramic capacitor is decreased by an amount in which the solder is decreased, and it is difficult to expect a large decrease in the acoustic noise even in a case in which an amount of the solder is decreased.

As another method, a method of changing an internal structure of the multilayer ceramic capacitor is present.

However, in the method of changing an internal structure of the multilayer ceramic capacitor, generally, a size or a form itself of a product is mainly changed, such that an appropriate method of mounting the multilayer ceramic capacitor needs to be separately introduced.

As another method, a method of controlling a direction in which the multilayer ceramic capacitor is mounted is present.

However, in the method of controlling a direction in which the multilayer ceramic capacitor is mounted, it is necessary to separately align the direction in which the multilayer ceramic capacitor is mounted, such that a separate preprocess may be required.

Meanwhile, in the multilayer ceramic capacitor, external electrodes are formed on the sintered ceramic body and then a process for sintering the external electrodes is performed.

Here, stress may occur during the sintering process, and radiating cracks may occur due to the stress.

SUMMARY

An aspect of the present disclosure may provide a multilayer ceramic capacitor capable of being manufactured in a general standard form and significantly decreasing the occurrence of an acoustic noise, regardless of cases in which the capacitor is mounted in a horizontal or vertical mounting direction, as well as suppressing radiating cracks due to stress occurred during a process of sintering external electrodes after the formation of the electrodes.

According to an aspect of the present disclosure, a multilayer ceramic capacitor may include: a ceramic body having a plurality of dielectric layers stacked therein; an active part including a plurality of first and second internal electrodes alternately exposed through end surfaces of the ceramic body, respectively, with each of the dielectric layers interposed between the first and second internal electrodes; upper and lower cover layers disposed on upper and lower portions of the active part, respectively; and first and second external electrodes including head parts formed on the both end surfaces of the ceramic body and band parts extended from the head parts to portions of a mounting surface of the ceramic body, wherein when a thickness of the upper or lower cover layer is defined as C, a width of a margin portion of the ceramic body in a width direction is defined as M, a cross-sectional area of the ceramic body in a width-thickness direction is defined as Ac, a cross-sectional area of the active part in a width-thickness direction in a portion thereof in which the first and second internal electrodes are overlapped with each other in a thickness direction is defined as Aa, and a width of the band part of the first or second external electrode is defined as B, $1.826 \leq C/M \leq 4.686$, $0.2142 \leq Aa/Ac \leq 0.4911$, and $0.5050 \leq C/B \leq 0.9094$ are satisfied.

When a thickness of the head part of the first or second external electrode is defined as H, $1.5 \leq C/H$ may be satisfied.

The width of the band part of the first or second external electrode may be greater than 260 μm.

The multilayer ceramic capacitor may have a capacitance of 10 μF or more.

A difference in distances of a width and a thickness of the ceramic body may be 15% or less.

The dielectric layer may have a thickness of 0.9 to 1.75 μm.

The width of the margin portion of the ceramic body in the width direction may be 90 μm or more.

According to another aspect of the present disclosure, a board having a multilayer ceramic capacitor mounted thereon may include: a substrate having first and second electrode pads formed thereon; and the multilayer ceramic capacitor mounted on the substrate.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
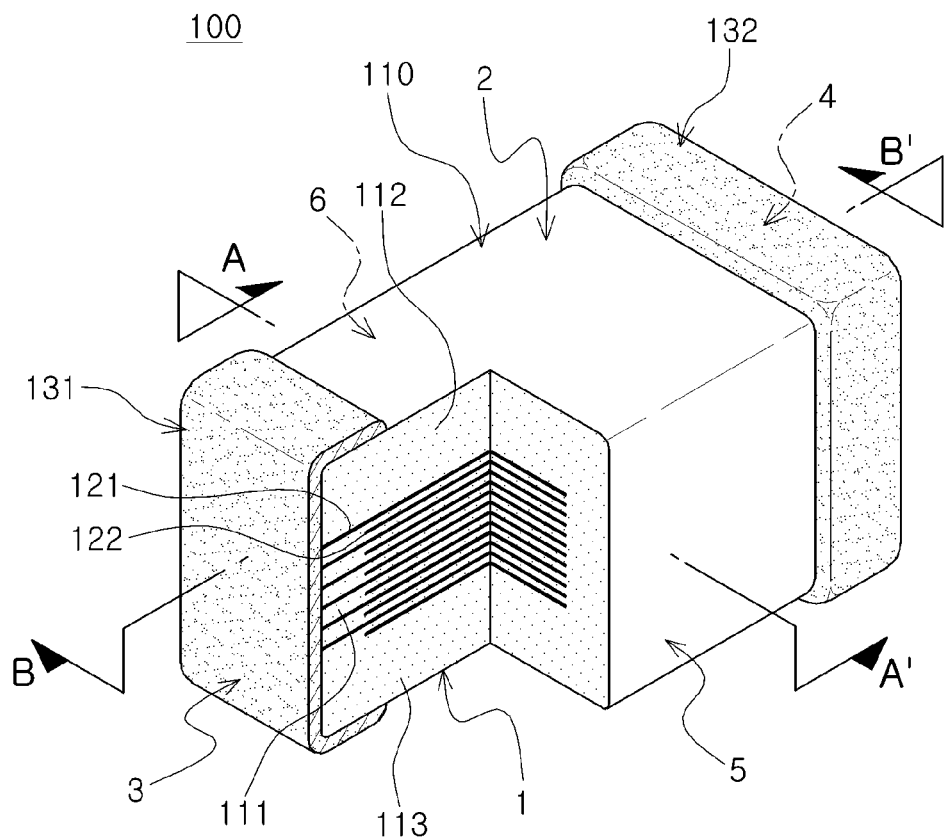
FIG. 1 is a partially cut-away perspective view schematically showing a multilayer ceramic capacitor according to an exemplary embodiment of the present disclosure.
Figure 1:
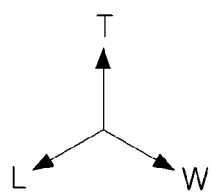

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Directions in a hexahedron will be defined in order to clearly describe exemplary embodiments of the present disclosure. L, W and T shown in the drawings refer to a length direction, a width direction, and a thickness direction, respectively.

Multilayer Ceramic Capacitor

FIG. 1 is a partially cut-away perspective view schematically showing a multilayer ceramic capacitor according to an exemplary embodiment of the present disclosure.

Referring to FIG. 1, a multilayer ceramic capacitor 100 according to the exemplary embodiment of the present disclosure may include a ceramic body 110, an active part 115 including first and second internal electrodes 121 and 122, upper and lower cover layers 112 and 113, and first and second external electrodes 131 and 132.

The ceramic body 110 may be formed by stacking a plurality of dielectric layers 111 and then sintering the same. A shape and a dimension of the ceramic body 110 and the number of stacked dielectric layers 111 are not limited to those of examples shown in the accompanying drawings.

Here, a difference in distances of a length and a width of the ceramic body 110 may be 15% or less, but the present disclosure is not limited thereto.

In addition, the plurality of dielectric layers 111 forming the ceramic body 110 may be in a sintered state and may be integrated such that a boundary between the dielectric layers 111 adjacent to each other are not readily apparent without a scanning electron microscope (SEM).

In addition, the ceramic body 110 may have a hexahedral shape.

In the present embodiment, for convenience of description, surfaces of the ceramic body 110 opposing each other in the thickness direction refer to first and second main surfaces 1 and 2, surfaces of the ceramic body 110 connecting the first and second main surface 1 and 2 and opposing each other in the length direction refer to first and second end surfaces 3 and 4, and surfaces of the ceramic body 110 connected to be perpendicular to the first and second end surfaces 3 and 4 and opposing each other in the width direction refer to first and second side surfaces 5 and 6.

The ceramic body 110 may include the active part 115 as apart contributing to capacitance formation of the capacitor and upper and lower cover layers 112 and 113 formed as upper and lower margin parts on the active part 115, respectively.

The active part 115 may be formed by alternately stacking the plurality of first and second internal electrodes 121 and 122 with each of the dielectric layers 111 interposed therebetween, in a repeated manner.

The upper and lower cover layers 112 and 113 may have the same material and configuration as those of the dielectric layers 111 of the active part 115 except that the internal electrodes are not included therein, but the present disclosure is not limited thereto.

The upper and lower cover layers 112 and 113 may be formed by stacking a single dielectric layer or two or more dielectric layers on upper and lower surfaces of the active part 115 in the thickness direction, respectively, and may basically serve to prevent damage to the first and second internal electrodes 121 and 122 due to physical or chemical stress.

The dielectric layers 111 may contain a ceramic material having a high dielectric constant, for example, a barium titanate ($BaTiO_3$) based powder, a strontium titanate ($SrTiO_3$) based powder, or the like. However, the present disclosure is not limited thereto as long as a sufficient capacitance may be obtained.

In addition, the dielectric layers 111 may further contain a ceramic additive, an organic solvent, a plasticizer, a binder, a dispersing agent, or the like, added thereto, if necessary, in addition to the ceramic powder.

Examples of the ceramic additive may include a transition metal oxide or carbide, rare earth elements, magnesium (Mg), aluminum (Al), and the like. However, the present disclosure is not limited thereto.

Here, a thickness of the dielectric layers 111 may be arbitrarily changed in accordance with a capacitance design of the multilayer ceramic capacitor 100, and a thickness of a single dielectric layer 111 may be 0.9 μm or more, preferably, 0.9 to 1.75 μm. However, the present disclosure is not limited thereto.

In a case in which the thickness of the single dielectric layer 111 is less than 0.9 μm, withstanding voltage characteristics may be deteriorated, and in a case in which the thickness of the single dielectric layer 111 exceeds 1.75 μm, a capacitance implementation rate may be lower than a reference value.

In the present exemplary embodiment, an interval between the internal electrodes adjacent to each other in a vertical direction is decreased as compared with a multilayer ceramic capacitor according to the related art, whereby the same capacitance as that of the multilayer ceramic capacitor according to the related art may be implemented with the number of stacked internal electrodes relatively smaller than that of stacked internal electrodes of the multilayer ceramic capacitor according to the related art, in the same sized chip as that of the multilayer ceramic capacitor according to the related art. Therefore, the upper and lower cover layers having a predetermined thickness may be secured, whereby a crack of the internal electrodes may be prevented and an acoustic noise may be decreased.

The first and second internal electrodes 121 and 122, electrodes having different polarities, may be formed by printing a conductive paste containing a conductive metal on one surfaces of the dielectric layers 111 at a predetermined thickness and may be alternately exposed through both end surfaces of the ceramic body 110 in a direction in which the dielectric layers 111 are stacked. The first and second internal electrodes 121 and 122 may be electrically insulated from each other by the dielectric layers 111 disposed therebetween.

The first and second internal electrodes 121 and 122 may be electrically connected to the first and second external electrodes 131 and 132 through portions thereof alternately exposed to both end surfaces of the ceramic body 110, respectively.

Therefore, when a voltage is applied to the first and second external electrodes 131 and 132, charges may be accumulated between the first and second internal electrodes 121 and 122 facing each other. In this case, a capacitance of the multilayer ceramic capacitor 100 may be proportional to an area of a region in which the first and second internal electrodes 121 and 122 are overlapped with each other in the active part 115.

Here, the first and second internal electrodes may be stacked such that the capacitance of the multilayer ceramic capacitor is 10 µF or more.

A thickness of the first or second internal electrode 121 or 122 may be determined depending on an intended use thereof. For example, the thickness of the first or second internal electrode 121 or 122 may be determined to be in a range of 0.2 to 1.0 µm in consideration of a size of the ceramic body 110. However, the present disclosure is not limited thereto.

For example, in a case in which the thickness of the first or second internal electrode 121 or 122 is less than 0.2 µm, electrode connectivity and withstanding voltage characteristics may be deteriorated, and in a case in which the thickness of the first or second internal electrode 121 or 122 exceeds 1.0 µm, delamination may be intensified due to steps between the margin part and the active part 115.

Further, the conductive metal contained in the conductive paste for forming the first and second internal electrodes 121 and 122 may be nickel (Ni), copper (Cu), palladium (Pd), or an alloy thereof, but the present disclosure is not limited thereto.

In addition, as a method of printing the conductive paste, a screen printing method, a gravure printing method, or the like, may be used. However, the present disclosure is not limited thereto.

The first and second external electrodes 131 and 132 may cover the first and second end surfaces 3 and 4 of the ceramic body 110, respectively.

In addition, the first and second external electrodes 131 and 132 may include first and second head parts 131a and 132a formed on the first and second end surfaces 3 and 4 of the ceramic body 110 and first and second band parts 131b and 132b extended from the first and second head parts 131a and 132a to portions of the first main surface 1, a mounting surface.

Here, the first and second external electrodes 131 and 132 may further have band parts extended from the first and second head parts 131a and 132a to portions of the second main surface 2 a surface opposite to the mounting surface.

In a case in which thicknesses C of the upper and lower cover layers 112 and 113 are identical to each other, when the multilayer ceramic capacitor is mounted on a board, it may be unnecessary to determine a mounting direction in which the capacitor is mounted with respect to the board.

Here, in a case in which a width of the first or second band part 131b or 132b is extremely decreased, adhesion strength of the external electrode may be deteriorated.

The width of the first or second band part 131b or 132b may be preferably, more than 260 µm, but the present disclosure is not limited thereto.

The first and second external electrodes 131 and 132 may be formed by a conductive paste containing a conductive metal.

The conductive metal may be nickel (Ni), copper (Cu), palladium (Pd), gold (Au), or an alloy thereof, but the present disclosure is not limited thereto.

Hereinafter, electrical features and an acoustic noise of the multilayer ceramic capacitor according to the present exemplary embodiment depending on dimensions of components included in the multilayer ceramic capacitor will be described.

Figure 2:
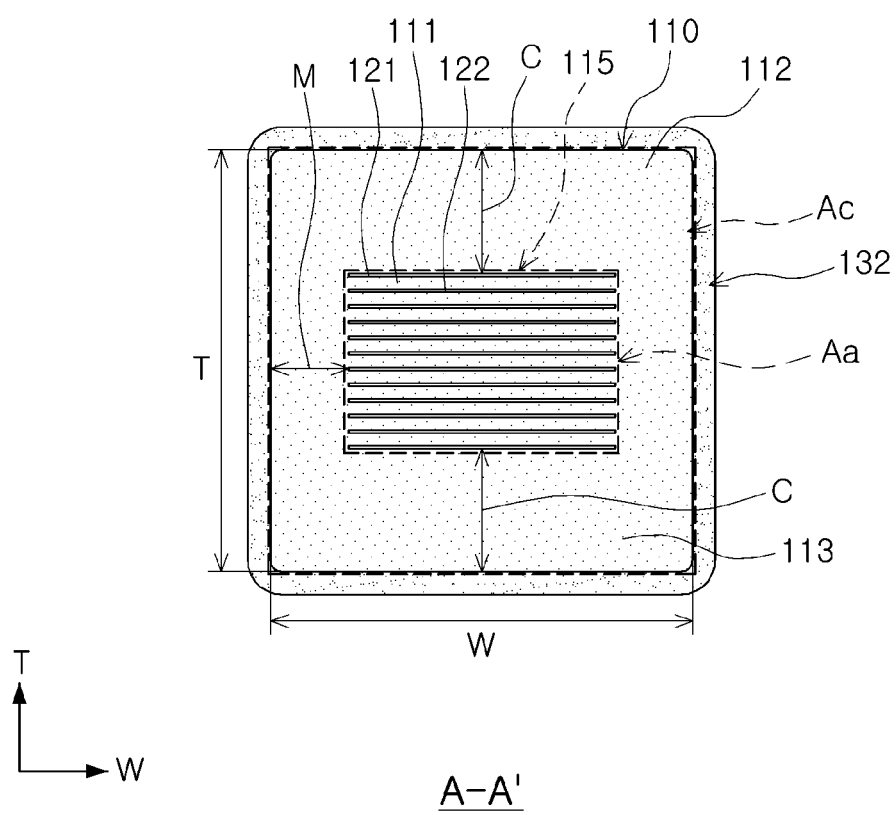
FIG. 2 is a cross-sectional view taken along line A-A' of FIG. 1.

FIG. 2 is a schematic cross-sectional view taken along line A-A' of the multilayer ceramic capacitor of FIG. 1 in order to describe a dimension relationship between components included in the multilayer ceramic capacitor.

Referring to FIG. 2, a thickness of each of the upper and lower cover layers 112 and 113 is defined as C, a width of a margin portion of the ceramic body 110 in the width direction is defined as M, a cross-sectional area of the ceramic body 110 in a width-thickness direction is defined as Ac, and a cross-sectional area of the active part 115 in the width-thickness direction is defined as Aa.

Here, the width M of the margin portion of the ceramic body 110 in the width direction refers to a distance from an edge of the active part 115 in which the first and second internal electrodes 121 and 122 are overlapped with each other to one side surface of the ceramic body 110, in the width direction.

In a multilayer ceramic capacitor according to the related art, an acoustic noise is generated in an active part due to piezoelectric properties of a dielectric material when power is applied to the multilayer ceramic capacitor. Particularly, in a high capacitance multilayer ceramic capacitor, the piezoelectric properties are increased, such that the acoustic noise may be significantly increased.

Since the acoustic noise is mainly caused by strain generated in a direction in which an electric field is applied, the margin parts provided on upper and lower portions of the active part may be enlarged, whereby the acoustic noise may be decreased.

In addition, magnitudes of an acoustic noise are different depending on whether the multilayer ceramic capacitor is mounted on a board to be parallel or perpendicular thereto. Thus, the multilayer ceramic capacitor needs to be mounted while amounting direction in which it is mounted with respect to the board is confirmed. In addition, in a case in which the mounting direction is erroneous, an acoustic noise may be increased as compared with the case of a design.

In the present embodiment of the present disclosure, when $1.826 \leq C/M \leq 4.686$ and $0.2142 \leq Aa/Ac \leq 0.4911$ are satisfied, a difference between an acoustic noise generated in a case in which the multilayer ceramic capacitor is mounted on a board to be parallel thereto and an acoustic noise generated in a case in which the multilayer ceramic capacitor is mounted on a board to be perpendicular thereto may be significantly decreased. That is, a value of the acoustic noise generated in the case in which the multilayer ceramic capacitor is mounted on a board to be perpendicular thereto and a value of the acoustic noise generated in the case in which the multilayer ceramic capacitor is mounted on a board to be parallel thereto may be substantially similar to each other.

When C/M is less than 1.826, a decrease effect of the acoustic noise may not be present, and a level of the acoustic noise generated in the case in which the multilayer ceramic capacitor is mounted on a board to be parallel thereto may be greater than that of the acoustic noise generated in the case in which the multilayer ceramic capacitor is mounted on a board to be perpendicular thereto.

In addition, when C/M exceeds 4.686, a margin part of the dielectric layers is excessively small, the probability that a cutting defect occurs during a process of cutting a multilayer body into individual chips may be increased.

Further, when Aa/Ac is less than 0.2142, the capacitance of the capacitor may be smaller than a required design value, while when Aa/Ac exceeds 0.4911, a ratio between the acoustic noise generated in the case in which the multilayer ceramic capacitor is mounted on a board to be parallel thereto and the acoustic noise generated in the case in which the multilayer ceramic capacitor is mounted on a board to be perpendicular thereto may exceed 1.1. Thus, different levels of acoustic noise may be generated in both cases.

Therefore, when a multilayer ceramic capacitor satisfy the ranges of $1.826 \leq C/M \leq 4.686$ and $0.2142 \leq Aa/Ac \leq 0.4911$, it may be unnecessary to determine the mounting direction in which a chip is mounted with respect to a board while a capacitance of the chip may be secured, thereby preventing the multilayer ceramic capacitor from being mounted on a board in an inappropriate direction to generate a significant acoustic noise as well as preventing the cutting defect from occurring in the process of cutting the multilayer body into individual chips.

Figure 3:
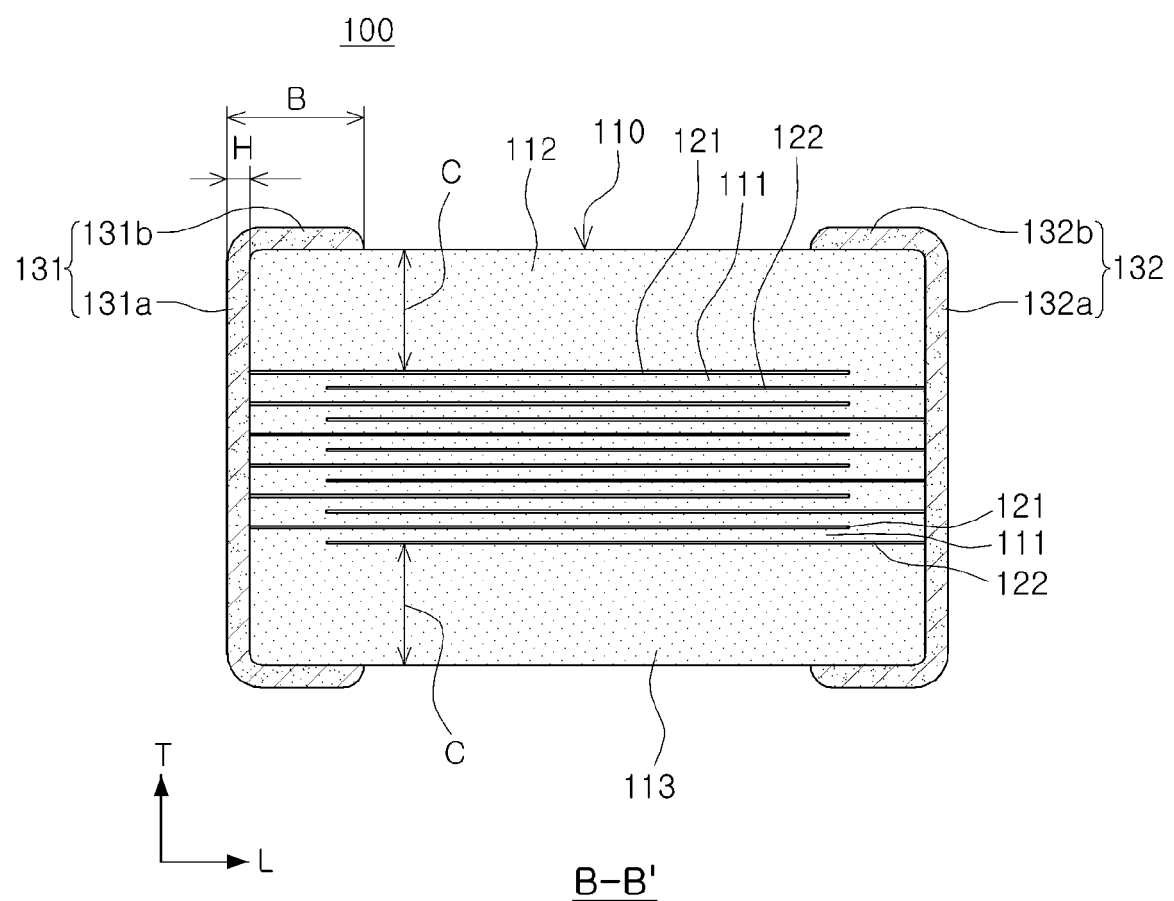
FIG. 3 is a cross-sectional view taken along line B-B' of FIG. 1.

FIG. 3 is a cross-sectional view schematically showing the multilayer ceramic capacitor taken along line B-B' of FIG. 1 in order to describe relationships among a ratio between a width of the band part of the external electrode and a thickness of the cover layer, radiating cracks, adhesion strength of the external electrode, and capacitance, in the multilayer ceramic capacitor.

Referring to FIG. 3, the thickness of each of the upper and lower cover layers 112 and 113 is defined as C, the width of the first or second band part 131b or 132b of the first or second external electrode 131 or 132 is defined as B, and a thickness of the first or second head part 131a or 132a of the first or second external electrode 131 or 132 is defined as H.

In general, in a multilayer ceramic capacitor, external electrodes are formed on a sintered ceramic body and then a sintering process is performed on the ceramic body.

Here, stress may occur during the sintering process, and radiating cracks may occur due to the stress.

In particular, in a case in which a thickness of a cover layer is decreased in order to significantly increase a capacitance of the multilayer ceramic capacitor, the multilayer ceramic capacitor may be more vulnerable to radiating cracks.

According to the present embodiment, when C/B satisfies $0.5050 \leq C/B \leq 0.9094$, the adhesion strength of the first and second external electrodes 131 and 132 may be maintained at a predetermined level, a designed capacitance may be implemented, and radiating cracks may be prevented.

When C/B is less than 0.5050, radiating cracks may occur, and when C/B is greater than 0.9094, a capacitance of the multilayer ceramic capacitor may be smaller than the designed value.

In addition, when C/H is less than 1.5, radiating cracks may occur.

Board Having Multilayer Ceramic Capacitor Mounted Thereon

Figure 4:
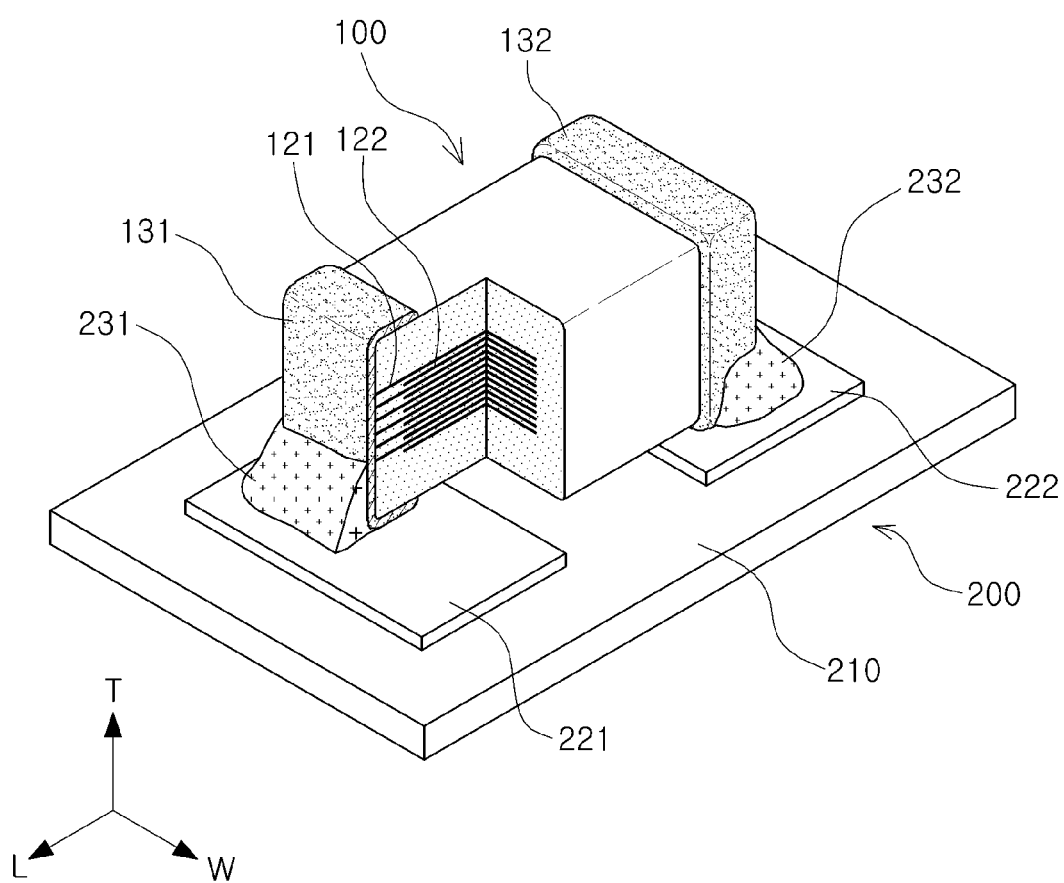
FIG. 4 is a perspective view showing a state in which the multilayer ceramic capacitor of FIG. 1 is mounted on a board.

FIG. 4 is a perspective view showing a state in which the multilayer ceramic capacitor of FIG. 1 is mounted on a board.

Referring to FIG. 4, a board 200 having the multilayer ceramic capacitor 100 mounted thereon according to the present exemplary embodiment may include a substrate 210 having the first and second internal electrodes 121 and 122 of the multilayer ceramic capacitor 100 mounted thereon to be parallel with respect to a mounting surface of the substrate and first and second electrode pads 221 and 222 formed on an upper surface of the substrate 210 to be spaced apart from each other.

Here, the multilayer ceramic capacitor 100 may be electrically connected to the substrate 210 by soldering parts 231 and 232 in a state in which the lower cover layer 113 thereof is disposed toward the substrate 210, and the first and second external electrodes 131 and 132 are positioned on the first and second electrode pads 221 and 222, respectively, to come into contact therewith, respectively.

When a voltage is applied to the multilayer ceramic capacitor 100 in a state in which the multilayer ceramic capacitor 100 is mounted on the substrate 210, an acoustic noise may be generated.

Here, sizes of the first and second electrode pads 221 and 222 may determine an amount of the soldering parts 231 and 232 connecting the first and second external electrodes 131 and 132 of the multilayer ceramic capacitor 100 and the first and second electrode pads 221 and 222, respectively, and a magnitude of the acoustic noise may be adjusted according to the amount of the soldering parts 231 and 232. However, the present disclosure is not limited thereto.

Generally, the reason why an acoustic noise is generated in the multilayer ceramic capacitor 100 is that when an electric field is applied to the multilayer ceramic capacitor 100, physical deformation of a dielectric material to which the electric field is applied may occur in the active part of the multilayer ceramic capacitor 100 due inverse piezoelectric properties of the dielectric layers 111 to thereby generate the displacement of a surface of the multilayer ceramic capacitor 100.

Here, the displacement occurring in the surface of the multilayer ceramic capacitor 100 may be caused by the deformation of the upper or lower cover layer 112 or 113 due to force resulting from deformation of the dielectric layers 111.

That is, the upper or lower cover layer 112 or 113 may be bent, and an amount of deformation of the upper or lower cover layer 112 or 113 may be proportional to (a length of the upper or lower cover layer/a thickness of the upper or lower cover layer)$^3$.

Therefore, since the multilayer ceramic capacitor 100 has a standard size, the thickness of the upper or lower cover layer 112 or 113 may be increased in order to decrease an amount of deformation of the multilayer ceramic capacitor 100 to result in a decrease in acoustic noise.

Meanwhile, the deformation of the dielectric layers 111 due to the electric field may cause deformation of the multilayer ceramic capacitor 100 in the width direction as well as the deformation thereof in the thickness direction by a Poisson effect.

Here, an amount of deformation generated in the multilayer ceramic capacitor 100 may be proportional to (a length T of the ceramic body/the width M of the margin portion of the ceramic body in the width direction)$^3$.

In general, since displacement of the multilayer ceramic capacitor 100 in the thickness direction is greater than displacement thereof in the width direction, an acoustic noise may be further decreased in a vertical mounting type scheme in which the capacitor is mounted on a board to be perpendicular with respect thereto, rather than being in a horizontal mounting type scheme in which the capacitor is mounted on a board to be parallel with respect thereto.

By way of example, in the case of Example 1 in which length×width of the multilayer ceramic capacitor was 1.6×0.8 mm, a level of an acoustic noise in the vertical mounting type scheme was about 38 dB and a level of an acoustic noise in the horizontal mounting type scheme was about 40 dB.

In addition, in the case of Example 2 in which length×width of the multilayer ceramic capacitor was 1.0×0.5 mm, a level of an acoustic noise in the vertical mounting type scheme was about 30 dB and a level of an acoustic noise in the horizontal mounting type scheme was about 35 dB.

Therefore, in order to implement similar levels of acoustic noise regardless of mounting directions in which the capacitor is mounted with respect to a board, the thicknesses of the upper and lower cover layers need to be larger than those of upper and lower cover layers of a general multilayer ceramic capacitor. However, in a case in which the thicknesses of the upper and lower cover layers are excessively large, the displacement of the multilayer ceramic capacitor in the width direction may be greater than the displacement thereof in the thickness direction. Therefore, it may be appreciated that the thicknesses of the upper and lower cover layers need to be in an appropriate range.

Experimental Example

Multilayer ceramic capacitors according to Inventive Examples and Comparative Examples were manufactured as follows.

Slurry containing a powder such as a barium titanate powder, or the like, was applied to carrier films and dried to prepare a plurality of ceramic green sheets.

Next, a conductive paste was applied to the ceramic green sheets using a screen printing method, or the like, to form first and second internal electrodes to be alternately exposed through both end surfaces of the ceramic green sheets.

The plurality of ceramic green sheets were stacked such that the first and second internal electrodes are alternately disposed, thereby forming a multilayer body.

Then, the ceramic green sheets on which the first and second internal electrodes are not formed were stacked on upper and lower surfaces of the multilayer body, respectively, to form upper and lower cover layers.

Next, the multilayer body having the upper and lower cover layers formed thereon was subjected to isostatic pressing under pressure conditions of about 1,000 kg·f/cm$^2$ at a temperature of about 85° C.

Thereafter, the pressed multilayer body was cut into individual chips, and the cut chip was maintained at a temperature of about 230° C. for about 60 hours under the air atmosphere and then, was subjected to a debinding process.

Next, the chip was sintered at a temperature of about 1200° C. under a reducing atmosphere having oxygen partial pressure of $10^{-11}$ to $10^{-10}$ atm lower than a Ni/NiO balanced oxygen partial pressure in such a manner that the first and second internal electrodes were not oxidized, thereby preparing a ceramic body.

Here, the conditions of the above-mentioned manufacturing processes are merely provided by way of example, and detailed conditions under which the multilayer ceramic capacitors according to Inventive Examples were manufactured may be variously changed.

Here, length×width×thickness (L×W×T) of the ceramic body 110 after being sintered was about 2.0 mm×1.2 mm×1.2 mm.

Next, a process of forming first and second external electrodes on first and second end surfaces of the ceramic body was performed to manufacture the multilayer ceramic capacitor.

Here, a manufacturing tolerance of length×width×thickness (L×W×T) of the multilayer ceramic capacitor was set to be in a range of ±0.1 mm, and in a case in which the manufacturing tolerance was in the range of ±0.1 mm, the multilayer ceramic capacitor was mounted on a board to be parallel or perpendicular thereto.

Multilayer ceramic capacitors used in the following experimentation had the same active region, and acoustic noises thereof were measured after only thicknesses of upper or lower cover layers and widths of margins of ceramic bodies in a width direction were adjusted.

Here, since the acoustic noise has a value resulting from dielectric properties, all of dielectric capacitances of the multilayer ceramic capacitors used in the experimentation were adjusted to have a value of about 10 μF and were adjusted not to at least exceed 10.3 μF.

In the following Table 1, HN indicates an acoustic noise value in a case in which the multilayer ceramic capacitor is mounted on a board to be parallel with respect thereto, and VN indicates an acoustic noise value in a case in which the multilayer ceramic capacitor is mounted on the board to be perpendicular with respect thereto.

TABLE 1

| # | W (um) | T (um) | M (um) | C (um) | C/M | HN (dB) | VN (dB) | HN/VN | Whether or not Cutting Defect Has Occurred |
|---|---|---|---|---|---|---|---|---|---|
| 1 | 1118 | 1122 | 136 | 121 | 0.890 | 47.6 | 36.8 | 1.29 | OK |
| 2 | 1120 | 1137 | 138 | 138 | 1.000 | 46.7 | 36.7 | 1.27 | OK |
| 3 | 1124 | 1157 | 142 | 159 | 1.120 | 47.1 | 36.6 | 1.29 | OK |
| 4 | 1121 | 1175 | 143 | 177 | 1.238 | 46.4 | 35.3 | 1.31 | OK |
| 5 | 1120 | 1200 | 141 | 202 | 1.433 | 45.6 | 35.7 | 1.28 | OK |
| 6 | 1118 | 1216 | 140 | 221 | 1.579 | 42.3 | 36.1 | 1.17 | OK |
| 7 | 1122 | 1251 | 142 | 248 | 1.746 | 41.8 | 36.6 | 1.14 | OK |
| 8* | 1125 | 1198 | 143 | 297 | 2.077 | 36.9 | 37.6 | 0.98 | OK |
| 9 | 1101 | 1102 | 119 | 97 | 0.815 | 48.7 | 36.4 | 1.34 | OK |
| 10 | 1102 | 1121 | 122 | 121 | 0.992 | 47.2 | 37.1 | 1.27 | OK |
| 11 | 1101 | 1137 | 121 | 140 | 1.157 | 47.4 | 37.4 | 1.27 | OK |
| 12 | 1101 | 1158 | 118 | 158 | 1.339 | 45.9 | 37.2 | 1.23 | OK |
| 13 | 1096 | 1179 | 120 | 181 | 1.508 | 44.3 | 36.9 | 1.20 | OK |
| 14 | 1097 | 1199 | 124 | 202 | 1.629 | 42.7 | 37.5 | 1.14 | OK |
| 15* | 1103 | 1217 | 121 | 221 | 1.826 | 41.3 | 37.9 | 1.09 | OK |
| 16* | 1100 | 1251 | 123 | 247 | 2.008 | 39.6 | 37.6 | 1.05 | OK |
| 17* | 1100 | 1302 | 124 | 303 | 2.444 | 38.8 | 38.1 | 1.02 | OK |
| 18* | 1098 | 1302 | 122 | 348 | 2.852 | 38.4 | 37.8 | 1.02 | OK |
| 19* | 1099 | 1398 | 117 | 403 | 3.444 | 37.6 | 38.3 | 0.98 | OK |
| 20* | 1099 | 1451 | 116 | 447 | 3.853 | 36.7 | 38.6 | 0.95 | OK |

TABLE 1-continued

| # | W (um) | T (um) | M (um) | C (um) | C/M | HN (dB) | VN (dB) | HN/VN | Whether or not Cutting Defect Has Occurred |
|---|--------|--------|--------|--------|-----|---------|---------|-------|---------|
| 21* | 1103 | 1501 | 121 | 498 | 4.116 | 36.1 | 39.3 | 0.92 | OK |
| 22* | 1102 | 1552 | 118 | 553 | 4.686 | 35.2 | 38.6 | 0.91 | OK |
| 23 | 1101 | 1598 | 120 | 596 | 4.967 | 33.5 | 40.8 | 0.82 | OK |
| 24 | 1082 | 1120 | 102 | 121 | 1.186 | 46.7 | 38.2 | 1.22 | OK |
| 25 | 1081 | 1139 | 101 | 138 | 1.366 | 45.3 | 38.5 | 1.18 | OK |
| 26 | 1082 | 1161 | 100 | 158 | 1.580 | 44.2 | 37.9 | 1.17 | OK |
| 27 | 1081 | 1179 | 101 | 181 | 1.792 | 43.7 | 38.8 | 1.13 | OK |
| 28* | 1083 | 1201 | 103 | 203 | 1.971 | 41.2 | 39.4 | 1.05 | OK |
| 29* | 1081 | 1218 | 99 | 222 | 2.242 | 39.7 | 39.1 | 1.02 | OK |
| 30* | 1080 | 1251 | 96 | 251 | 2.615 | 38.1 | 39.8 | 0.96 | OK |
| 31* | 1080 | 1304 | 101 | 304 | 3.010 | 37.4 | 40.2 | 0.93 | OK |
| 32 | 1061 | 1121 | 81 | 123 | 1.519 | 45.3 | 37.5 | 1.21 | NG |
| 33 | 1060 | 1139 | 80 | 138 | 1.725 | 44.1 | 38.4 | 1.15 | NG |
| 34* | 1059 | 1161 | 79 | 157 | 1.987 | 42.9 | 39.3 | 1.09 | NG |
| 35* | 1161 | 1178 | 77 | 181 | 2.351 | 42.7 | 39.7 | 1.08 | NG |
| 36* | 1059 | 1202 | 76 | 200 | 2.632 | 41.2 | 39.6 | 1.04 | NG |
| 37* | 1062 | 1221 | 80 | 222 | 2.775 | 39.2 | 39.4 | 0.99 | NG |
| 38* | 1063 | 1251 | 80 | 247 | 3.088 | 38.5 | 40.4 | 0.95 | NG |
| 39* | 1062 | 1301 | 82 | 303 | 3.695 | 37.2 | 40.2 | 0.93 | NG |
| 40* | 1058 | 1352 | 78 | 351 | 4.500 | 36.8 | 40.3 | 0.91 | NG |
| 41 | 1061 | 1398 | 83 | 398 | 4.795 | 35.7 | 40.7 | 0.88 | NG |
| 42 | 1061 | 1451 | 77 | 447 | 5.805 | 34.3 | 40.5 | 0.85 | NG |
| 43 | 1058 | 1502 | 83 | 498 | 6.000 | 32.8 | 41.7 | 0.79 | NG |
| 44 | 1060 | 1547 | 81 | 549 | 6.778 | 31.1 | 41.6 | 0.75 | NG |
| 45 | 1059 | 1603 | 79 | 600 | 7.595 | 29.7 | 42.1 | 0.71 | NG |
| 46 | 1139 | 1103 | 59 | 98 | 1.661 | 43.6 | 37.5 | 1.16 | NG |
| 47* | 1042 | 1121 | 62 | 118 | 1.903 | 41.5 | 38.1 | 1.09 | NG |
| 48* | 1041 | 1128 | 61 | 132 | 2.164 | 40.8 | 38.3 | 1.07 | NG |
| 49* | 1038 | 1157 | 58 | 158 | 2.724 | 40.2 | 38.2 | 1.05 | NG |
| 50* | 1042 | 1176 | 62 | 179 | 2.887 | 39.7 | 38.7 | 1.03 | NG |
| 51* | 1039 | 1203 | 66 | 202 | 3.061 | 38.6 | 39.8 | 0.97 | NG |
| 52* | 1038 | 1152 | 53 | 247 | 4.660 | 37.2 | 40.9 | 0.91 | NG |
| 53 | 1041 | 1301 | 54 | 303 | 5.611 | 35.8 | 41.6 | 0.86 | NG |
| 54 | 1045 | 1351 | 61 | 352 | 5.770 | 35.1 | 42.1 | 0.83 | NG |
| 55 | 1036 | 1400 | 63 | 406 | 6.444 | 34.8 | 42.5 | 0.82 | NG |

It was confirmed from Table 1 above that in sample Nos. 8, 15-22, 28-31, 34-40 and 47-52, in which a range of C/M value was 1.826 to 4.686, a ratio (HN/VN) of the acoustic noise value HN in the case in which the multilayer ceramic capacitor is mounted on a board to be parallel with respect thereto, to the acoustic noise value VN in the case in which the multilayer ceramic capacitor is mounted on the board to be perpendicular with respect thereto was in a range of 0.9 to 1.1, relatively small.

Therefore, it may be appreciated that the value of C/M for implementing a uniform level of acoustic noise in the multilayer ceramic capacitor, regardless of whether the multilayer ceramic capacitor is mounted on a board to be parallel or perpendicular with respect thereto satisfies a range of 1.826≤C/M≤4.686.

In addition, it was confirmed that in a case in which the value of C/M satisfies the range of 1.826≤C/M≤4.686, a difference in distances of the width W and the thickness T of the ceramic body was 15% or less.

In addition, a cutting defect was confirmed in Samples 32 to 55 in which the margin portion of the ceramic body in the width direction had a width M of less than 90 μm.

Therefore, it could be confirmed that the margin portion of the ceramic body in the width direction, capable of preventing the cutting defect of a product, had a width M of 90 μm or more.

In addition, it may be appreciated that in Samples 17 to 23, 31, 39 to 45, and 53 to 55 in which the thickness C of the cover layer was excessively increased, a size of a completed chip was excessively large, such that a size standard of the multilayer ceramic capacitor could not be satisfied.

The following Table 2 shows a ratio Aa/Ac of a cross-sectional area Aa of an active part in a width-thickness direction, in a portion thereof in which the first and second internal electrodes are overlapped with each other in a thickness direction, to a cross-sectional area Ac of the ceramic body in the width-thickness direction.

The ratio Aa/Ac of the cross-sectional areas were obtained by measuring the cross-sectional areas from an image obtained by photographing a cross-section of the multilayer ceramic capacitor cut in the thickness direction at a central portion of the ceramic body in a width direction in the multilayer ceramic capacitor, using a scanning electron microscope (SEM).

TABLE 2

| # | Aa/Ac (%) | Capacitance Implementation Rate (%) | Withstand Voltage (V) | Acoustic Noise of Horizontal Mounting type | Acoustic Noise of Vertical Mounting type | HN/VN |
|---|-----------|--------------------------------------|------------------------|---------------------------------------------|-------------------------------------------|-------|
| 1 | 62.05 | 283% | 110 | 48.3 | 39.4 | 1.23 |
| 2 | 56.54 | 256% | 112 | 46.1 | 38.6 | 1.19 |
| 3 | 50.99 | 228% | 108 | 41.9 | 36.9 | 1.14 |
| 4 | 49.11 | 223% | 114 | 37.7 | 36.1 | 1.04 |
| 5 | 48.04 | 220% | 112 | 36.8 | 35.8 | 1.03 |
| 6 | 45.87 | 214% | 116 | 36.5 | 34.7 | 1.05 |
| 7 | 42.03 | 195% | 116 | 35.8 | 33.4 | 1.07 |

TABLE 2-continued

| # | Aa/Ac (%) | Capacitance Implementation Rate (%) | Withstand Voltage (V) | Acoustic Noise of Horizontal Mounting type | Acoustic Noise of Vertical Mounting type | HN/VN |
|---|---|---|---|---|---|---|
| 8 | 27.18 | 122% | 109 | 33.6 | 32.3 | 1.04 |
| 9 | 22.15 | 108% | 110 | 32.8 | 31.8 | 1.03 |
| 10 | 21.42 | 101% | 107 | 31.2 | 30.7 | 1.02 |
| 11 | 19.17 | 87% | 116 | 29.6 | 30.5 | 0.97 |
| 12 | 18.26 | 81% | 115 | 27.4 | 29.1 | 0.94 |

It was confirmed from the above Table 2 that in all Samples, levels of withstanding voltage are substantially similar to each other, and in Samples 4 to 10 in which a range of Aa/Ac was 0.2142 to 0.4911, a capacitance implementation rate was 100% or more and levels of acoustic noise in horizontal mounting and vertical mounting schemes were similar to each other.

In Samples 11 and 12 in which the value of Aa/Ac was less than 0.2142, a capacitance implementation rate was less than 100%, problematic, and in Samples 1 to 3 in which the value of Aa/Ac exceeded 0.4911, a ratio of differences in the levels of acoustic noises in the horizontal mounting and vertical mounting schemes exceeded 1.1, problematic.

Meanwhile, since a capacitance of the multilayer ceramic capacitor is in inverse proportion to an interval between the internal electrodes, the capacitance may be increased through a decrease in a thickness of the dielectric layer.

In addition, since withstanding voltage characteristics of the multilayer ceramic capacitor satisfy an equation (E=V/d) of an electric field E generated in a case in which a potential difference between the internal electrodes is applied, they may be increased as the interval between the internal electrodes is decreased.

Further, a breakdown occurs when an electric field greater than dielectric strength, an intrinsic physical property, of a material is applied. Thus, in a case in which the same potential is applied to the multilayer ceramic capacitor when the thickness of the dielectric layer was decreased, strength of the applied electric field may be increased, such that the withstanding voltage characteristics of the multilayer ceramic capacitor may be deteriorated.

That is, in a case in which deterioration phenomenon generated when the thickness of the dielectric layer is decreased may be adjusted in order to implement the same capacitance, capacitance density may be further increased.

The following Table 3 shows a capacitance implementation ratio and withstand voltage properties of the multilayer ceramic capacitor measured after the thickness of the dielectric layer is adjusted.

TABLE 3

| # | Thickness (um) of Dielectric Layer | Number of Stacked Dielectric Layers | Capacitance Implementation Rate (%) | Withstand Voltage (V) |
|---|---|---|---|---|
| 1 | 0.448 | 590 | 752% | 5 |
| 2 | 0.640 | 520 | 455% | 60 |
| 3 | 0.800 | 475 | 328% | 85 |
| 4 | 0.901 | 450 | 281% | 112 |
| 5 | 1.152 | 395 | 192% | 144 |
| 6 | 1.792 | 307 | 96% | 224 |
| 7 | 2.816 | 225 | 45% | 332 |

It could be appreciated from Table 3 above that in a case in which the thickness of the dielectric layer was decreased, withstand voltage was decreased and capacitance was increased.

In addition, it could be confirmed that in Sample 1 in which the thickness of the dielectric layer was decreased to 0.5 μm or less, the withstanding voltage characteristics were rapidly deteriorated.

The thickness of the ceramic green sheet in which the withstanding voltage characteristics were rapidly deteriorated may be reduced as a particle size of BT powder is decreased.

It could be appreciated from Table 3 that in Samples 4 to 7 in which the thickness of the dielectric layer was 0.9 μm or more, even though the number of stacked dielectric layers was less than 500, the withstanding voltage was 100 V or more.

However, in Samples 6 and 7 in which the thickness of the dielectric layer exceeded 1.75 μm, the capacitance implementation rate was lower than 100%.

Therefore, it could be confirmed that the thickness of the dielectric layer simultaneously satisfying the withstanding voltage and the capacitance implementation rate characteristics was 0.9 to 1.75 μm.

The following Table 4 shows whether or not radiating cracks occurred, whether or not a adhesion strength defect of the external electrode occurred, and whether or not a reference value of capacitance was satisfied, depending on changes in the width of the band part of the external electrode and the thickness of the cover layer in the multilayer ceramic capacitor.

TABLE 4

| # | B (um) | C (um) | C/B (%) | Whether or Not Cracks Occurred | Adhesion Strength | Capacitance |
|---|---|---|---|---|---|---|
| 1 | 395 | 103 | 25.95 | Occurrence | ○ | ◎ |
| 2 | 398 | 129 | 32.39 | Occurrence | ○ | ◎ |
| 3 | 396 | 159 | 40.06 | Occurrence | ○ | ◎ |
| 4 | 400 | 191 | 47.81 | Occurrence | ○ | ◎ |
| 5 | 399 | 223 | 55.80 | Non-Occurrence | ○ | ◎ |
| 6 | 395 | 258 | 65.19 | Non-Occurrence | ○ | ○ |
| 7 | 398 | 316 | 79.56 | Non-Occurrence | ○ | ○ |
| 9 | 374 | 104 | 27.76 | Occurrence | ○ | ◎ |
| 10 | 375 | 130 | 34.67 | Occurrence | ○ | ◎ |
| 11 | 371 | 158 | 42.42 | Occurrence | ○ | ◎ |
| 12 | 374 | 189 | 50.50 | Non-Occurrence | ○ | ◎ |
| 13 | 370 | 229 | 61.82 | Non-Occurrence | ○ | ◎ |
| 14 | 373 | 250 | 67.11 | Non-Occurrence | ○ | ○ |
| 15 | 370 | 316 | 85.47 | Non-Occurrence | ○ | ○ |
| 16 | 375 | 371 | 99.00 | Non-Occurrence | ○ | X |
| 17 | 346 | 101 | 29.24 | Occurrence | ○ | ◎ |
| 18 | 349 | 129 | 36.92 | Occurrence | ○ | ◎ |
| 19 | 346 | 155 | 44.77 | Occurrence | ○ | ◎ |
| 20 | 344 | 189 | 54.91 | Non-Occurrence | ○ | ◎ |
| 21 | 350 | 228 | 65.00 | Non-Occurrence | ○ | ◎ |
| 22 | 345 | 251 | 72.83 | Non-Occurrence | ○ | ○ |
| 23 | 345 | 314 | 90.94 | Non-Occurrence | ○ | ○ |
| 24 | 348 | 370 | 106.47 | Non-Occurrence | ○ | X |
| 25 | 325 | 103 | 31.54 | Occurrence | X | ◎ |
| 26 | 319 | 129 | 40.39 | Occurrence | X | ◎ |
| 27 | 324 | 190 | 58.69 | Non-Occurrence | X | ◎ |
| 28 | 321 | 255 | 79.38 | Non-Occurrence | X | ○ |
| 29 | 321 | 366 | 114.01 | Non-Occurrence | X | X |

Here, B indicates a width of the first or second band part of the first or second external electrode and C indicates a thickness of the upper or lower cover layer.

In order to determine whether or not crack occurred, 1000 multilayer ceramic capacitors were examined for each condition, and in 1000 multilayer ceramic capacitors, even in a case in which only one multilayer ceramic capacitor had radiating cracks occurred therein, it was indicated as a crack occurrence.

In order to determine whether or not adhesion strength is present, 1000 multilayer ceramic capacitors were examined for each condition, and in 1000 multilayer ceramic capacitors, even in a case in which the external band of only one multilayer ceramic capacitor was separated from the ceramic body, it was indicated as X.

With respect to capacitance, ⊚ indicates a case in which a capacitance of 100% or more was implemented as compared to the designed value (excellence), ○ indicates a case in which a capacitance of 90% or more was implemented as compared to the designed value (good), and x indicates a case in which an actual capacitance was smaller than the designed value (poor).

It was confirmed from Table 4 above that in samples 5-7, 12-16, 20-24 and 27-29 in which the value of C/B was equal to or greater than 0.5050, radiating cracks did not occur in the multilayer ceramic capacitor.

However, it was confirmed that in samples 16, 24 and 29 in which the value of C/B was greater than 0.9094, a thickness of the cover layer was relatively large, the capacitance of the multilayer ceramic capacitor was extremely smaller than the designed value.

In addition, it was confirmed that in sample 25-29 in which the value of B was 260 μm or less, the width of the band of the external electrode was extremely small, such that adhesion strength defect in which the band part of the external electrode was separated from the ceramic body occurred.

Therefore, it could be appreciated that the value of C/B for maintaining adhesion strength of the first and second external electrodes 131 and 132 to be a predetermined level, while implementing a designed capacitance as well as preventing radiating cracks satisfied 0.5050≤C/B≤0.9094.

The following Table 5 shows whether or not cracks occurred depending on a change in a thickness of the head part of the external electrode in the multilayer ceramic capacitor.

TABLE 5

| # | H(um) | C(um) | C/H (%) | Whether or Not Cracks Occurred |
|---|---|---|---|---|
| 1 | 125 | 100 | 80 | Occurrence |
| 2 | 125 | 125 | 100 | Occurrence |
| 3 | 125 | 188 | 150 | Non-Occurrence |
| 4 | 125 | 250 | 200 | Non-Occurrence |
| 5 | 125 | 313 | 250 | Non-Occurrence |
| 6 | 125 | 375 | 300 | Non-Occurrence |
| 7 | 156 | 250 | 160 | Non-Occurrence |
| 8 | 188 | 250 | 133 | Occurrence |
| 9 | 219 | 250 | 114 | Occurrence |
| 10 | 250 | 250 | 100 | Occurrence |

Here, H indicates a thickness of the first or second head part of the first or second external electrode and C indicates a thickness of the upper or lower cover layer.

In order to determine whether or not crack occurred, 1000 multilayer ceramic capacitors were examined for each condition, and in 1000 multilayer ceramic capacitors, even in a case in which only one multilayer ceramic capacitor had radiating cracks occurred therein, it was indicated as a crack occurrence.

It was confirmed from Table 5 above that in samples 3-6 in which C/H was 150% or more, radiating cracks did not occur in the multilayer ceramic capacitor.

Therefore, it could be appreciated that C/H satisfied 1.5≤C/H for preventing radiating cracks.

As set forth above, according to exemplary embodiments of the present disclosure, a difference between the acoustic noise generated in a case in which the multilayer ceramic capacitor is mounted on a board to be parallel thereto and the acoustic noise generated in a case in which the multilayer ceramic capacitor is mounted on the board to be perpendicular thereto may be significantly decreased, such that it may be unnecessary to determine the mounting direction in which a chip is mounted with respect to the board.

In addition, the ratio of the thickness of the cover layer to the width of the band part of the external electrode may be adjusted, such that radiating cracks caused by stress occurred during a process of sintering the external electrode after the forming of the external electrode may be suppressed.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor comprising:
a ceramic body having a plurality of dielectric layers stacked therein;
an active part including a plurality of first and second internal electrodes alternately exposed through end surfaces of the ceramic body, respectively, with each of the dielectric layers interposed between the first and second internal electrodes;
upper and lower cover layers disposed on upper and lower portions of the active part, respectively; and
first and second external electrodes including head parts formed on the both end surfaces of the ceramic body and band parts extended from the head parts to portions of a mounting surface of the ceramic body,
wherein when a thickness of the upper or lower cover layer is defined as C, a width of a margin portion of the ceramic body in a width direction is defined as M, a cross-sectional area of the ceramic body in a width-thickness direction is defined as Ac, a cross-sectional area of the active part in a width-thickness direction in a portion thereof in which the first and second internal electrodes are overlapped with each other in a thickness direction is defined as Aa, and a width of the band part of the first or second external electrode is defined as B, 1.826≤C/M≤4.686, 0.2142≤Aa/Ac≤0.4911, and 0.5050≤C/B≤0.9094 are satisfied.

2. The multilayer ceramic capacitor of claim 1, wherein when a thickness of the head part of the first or second external electrode is defined as H, 1.5≤C/H is satisfied.

3. The multilayer ceramic capacitor of claim 1, wherein the width of the band part of the first or second external electrode is greater than 260 μm.

4. The multilayer ceramic capacitor of claim 1, wherein the multilayer ceramic capacitor has a capacitance of 10 uF or more.

5. The multilayer ceramic capacitor of claim 1, wherein a difference in distances of a width and a thickness of the ceramic body is 15% or less.

6. The multilayer ceramic capacitor of claim 1, wherein the dielectric layer has a thickness of 0.9 to 1.75 μm.

7. The multilayer ceramic capacitor of claim 1, wherein the width of the margin portion of the ceramic body in the width direction is 90 μm or more.

8. A board having a multilayer ceramic capacitor mounted thereon, comprising:

a substrate having first and second electrode pads formed thereon; and the multilayer ceramic capacitor mounted on the substrate, the multilayer ceramic capacitor including:

a ceramic body having a plurality of dielectric layers stacked therein;

an active part including a plurality of first and second internal electrodes alternately exposed through end surfaces of the ceramic body, respectively, with each of the dielectric layers interposed between the first and second internal electrodes, and disposed to be parallel with respect to a mounting surface of the substrate;

upper and lower cover layers disposed on upper and lower portions of the active part, respectively; and first and second external electrodes including head parts formed on the both end surfaces of the ceramic body and band parts extended from the head parts to portions of a mounting surface of the ceramic body, and wherein when a thickness of the upper or lower cover layer is defined as C, a width of a margin portion of the ceramic body in a width direction is defined as M, a cross-sectional area of the ceramic body in a width-thickness direction is defined as Ac, a cross-sectional area of the active part in the width-thickness direction in a portion thereof in which the first and second internal electrodes are overlapped with each other in a thickness direction is defined as Aa, and a width of the band part of the first or second external electrode is defined as B, $1.826 \leq C/M \leq 4.686$, $0.2142 \leq Aa/Ac \leq 0.4911$, and $0.5050 \leq C/B \leq 0.9094$ are satisfied.

9. The board of claim 8, wherein when a thickness of the head part of the first or second external electrode is defined as H, $1.5 \leq C/H$ is satisfied.

10. The board of claim 8, wherein the width of the band part of the first or second external electrode is greater than 260 μm.

11. The board of claim 8, wherein the multilayer ceramic capacitor has a capacitance of 10 uF or more.

12. The board of claim 8, wherein a difference in distances of a width and a thickness of the ceramic body is 15% or less.

13. The board of claim 8, wherein the dielectric layer has a thickness of 0.9 to 1.75 μm.

14. The board of claim 8, wherein the width of the margin portion of the ceramic body in the width direction is 90 μm or more.

* * * * *